(12) United States Patent
Hynecek et al.

(10) Patent No.: US 8,618,459 B2
(45) Date of Patent: *Dec. 31, 2013

(54) IMAGE SENSOR ARRAY FOR THE BACK SIDE ILLUMINATION WITH JUNCTION GATE PHOTODIODE PIXELS

(75) Inventors: Jaroslav Hynecek, Allen, TX (US); Hirofumi Komori, San Jose, CA (US); Xia Zhao, Campbell, CA (US)

(73) Assignee: Aptina Imaging Corporation, George Town (KY)

( * ) Notice: Subject to any disclaimer, the term of this patent is extended or adjusted under 35 U.S.C. 154(b) by 218 days.

This patent is subject to a terminal disclaimer.

(21) Appl. No.: 13/210,615

(22) Filed: Aug. 16, 2011

(65) Prior Publication Data
US 2012/0273653 A1    Nov. 1, 2012

Related U.S. Application Data

(60) Provisional application No. 61/479,496, filed on Apr. 27, 2011.

(51) Int. Cl.
*H01L 27/148* (2006.01)
*H01L 31/18* (2006.01)

(52) U.S. Cl.
USPC ............... 250/208.1; 250/214.1; 257/291; 257/E27.159; 438/76

(58) Field of Classification Search
USPC ........... 250/208.1, 214.1; 257/222, 291, 292, 257/E31.097, E27.159; 438/76
See application file for complete search history.

(56) References Cited

U.S. PATENT DOCUMENTS 5,070,380 A * 12/1991 Erhardt et al. ............. 257/222
2012/0273654 A1 * 11/2012 Hynecek et al. ........... 250/208.1

OTHER PUBLICATIONS

Yasutomi, Keita, "A 2.7e Temporal Noise 99.7% Shutter Efficiency 92dB Dynamic Range CMOS Image Sensor with Dual Global Shutter Pixels", IEEE International Solid-State Circuits Conference, (Feb. 10, 2010), 3 pgs.

* cited by examiner

*Primary Examiner* — Kevin Pyo

(57) ABSTRACT

The present invention relates to a junction gate photo-diode (JGP) pixel that includes a JGP for accumulating charge in response to impinging photons. The JGP is positioned on a substrate and includes a top n layer, a middle p layer and a bottom n layer forming a n-p-n junction, and a control terminal coupled to the top n layer. Also included is a floating diffusion (FD) positioned on the substrate and coupled to a pixel output line through an amplifier. Also included is a pinned barrier (PB) positioned on the substrate between the JGP and the FD, the PB temporarily blocks charge transfer between the JGP and the FD. The accumulated charge is transferred from the JGP to FD by applying a control voltage to the JGP control terminal.

20 Claims, 9 Drawing Sheets

IMAGE SENSOR ARRAY FOR THE BACK SIDE ILLUMINATION WITH JUNCTION GATE PHOTODIODE PIXELS

CROSS REFERENCE TO RELATED APPLICATIONS

This application claims priority of U.S. Provisional Patent Application Ser. No. 61/479,496, filed Apr. 27, 2011, which is incorporated herein by reference.

FIELD OF THE INVENTION

The present invention relates, in general, to a back side illuminated (BSI) image sensor that implements pixels having junction gate photo-diodes (JGPs) and pinned barriers. The charge well potential of the JGP is controllable which eliminates the need for a conventional complementary metal-oxide semi-conductor (CMOS) transfer gates. The conventional MOS source follower transistor may also be replaced by a junction field effect transistor (JFET). The present invention also provides a feedback circuit that couples a column amplifier to a floating diffusion (FD) of the pixels through a capacitor to minimize voltage swing.

BACKGROUND OF THE INVENTION

In conventional CMOS sensors, the circuitry for a plurality of photo-diodes is shared. The pixels may include two photo-diodes located in neighboring rows that share the same circuitry. Such a shared circuit concept can result in having two metal bus lines in the row direction and two metal bus lines in the column direction per photo-diode as shown in FIG. 1.

Circuit 100 represents the schematic diagram of a four transistor (4T) shared circuit pixel with two photo-diodes 107 and 108. The photo-diodes are coupled through charge transfer transistors 109 and 110 respectively to a common floating diffusion (FD) charge detection node 115. The FD node 115 is connected to the gate of the source follower (SF) transistor 112, whose drain is connected via line 116 to the Vdd column bus line 101. The source of the SF is connected via the address transistor Sx 113 and line 117 to output signal column bus line 102. The FD node is reset by transistor 111 whose drain is connected to line 116. The control signals to the address transistor 113, the reset transistor 111, and charge transfer transistors 109 and 110 are supplied by the row bus lines 114, 106, 104 and 105 respectively. As can be seen from the schematic diagram, the circuit that has two photo-diodes, and includes two row bus lines and two column bus lines per photodiode. In conventional circuits, it is also necessary to provide an additional connections between the elements of the circuit in the column direction as is illustrated by the wire 103.

DETAILED DESCRIPTION OF THE INVENTION

In general, the present invention provides a JGP pixel design with vertical blooming control, which may be used in high performance back-side illuminated (BSI) image sensor arrays. The vertical blooming control provides a reduction in the pixel size, thereby providing a BSI image senor array with high pixel density while preserving the pixel high well capacity, low dark current, high Dynamic Range, and low noise.

Several embodiments of the invention are described that use a plurality of JGPs and shared circuitry. A negative feedback into the floating diffusion (FD) node is also described which reduces the voltage swing on the FD node, reduces the source follower (SF) noise, and increases the dynamic range (DR) of the sensor while obtaining a small pixel size.

A JGP is a photo-diode that has a control gate. This allows the JGP to be biased differently during charge integration and charge transfer. The bias can be lowered during the charge transfer cycle, and charge transferred to the FD through a pinned charge transfer barrier. An advantage of the JGP is vertical blooming control and low dark current since the dark current generated at the silicon-silicon dioxide interface is drained directly to the gate. The potential profile of the structure may be designed such that the overflow charge is also drained to the gate.

Figure 1:
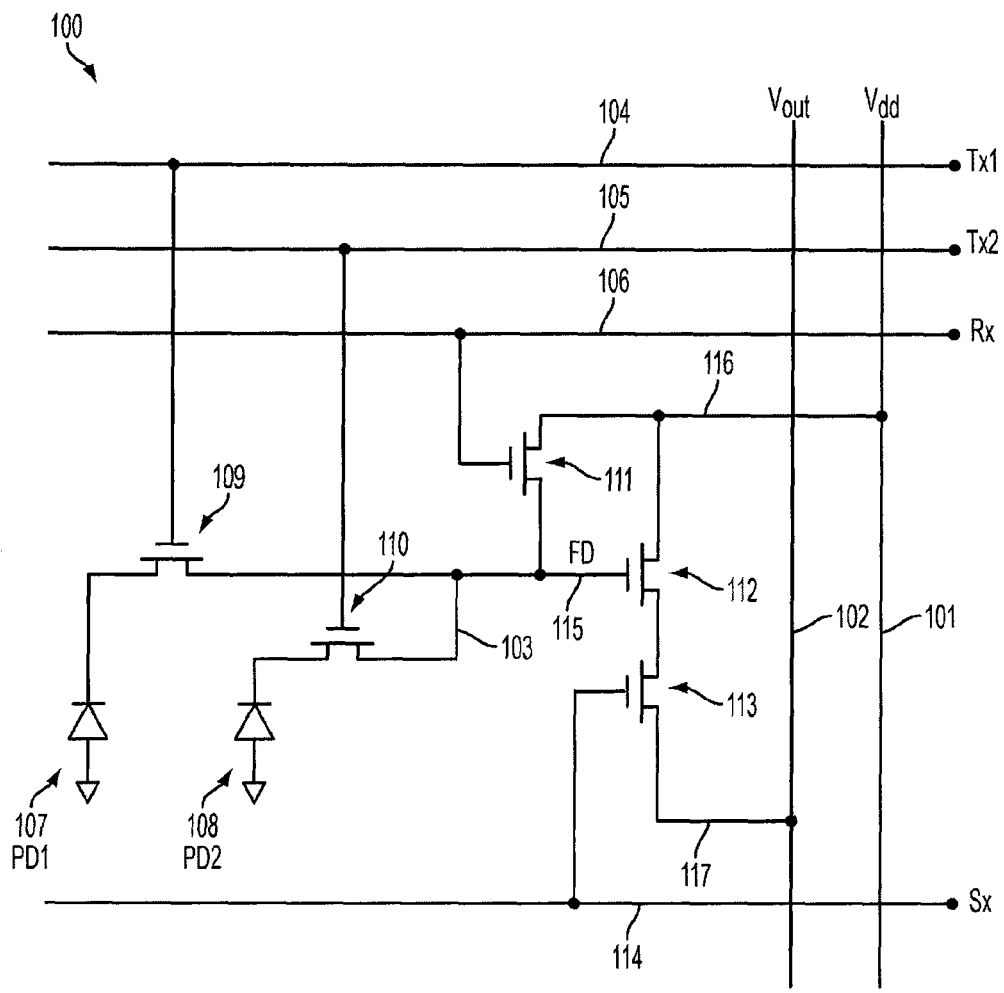
FIG. 1 shows a schematic diagram of a row-shared pixel circuit with two pinned photo-diodes per circuit that is operating on the 4T principle.
Figure 2:
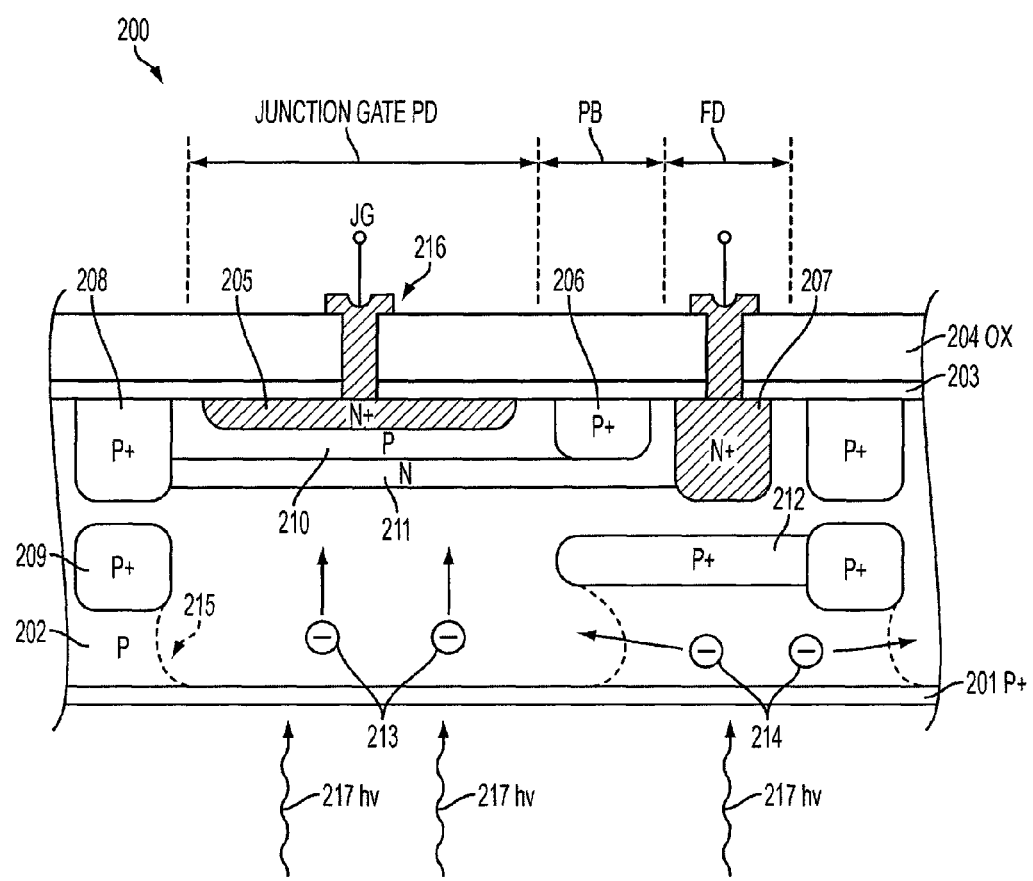
FIG. 2 shows a cross-sectional view of the back side illuminated JGP pixel, according to an embodiment of the present invention.

The basic concept of junction gate photodiode JGP pixel is shown in FIG. 2. The cross section through the JGP pixel, pinned barrier region, and the floating diffusion region (FD) is shown. The JGP pixel is formed on a p-type doped substrate 202 that has a p+ doped layer 201 deposited on the back surface to reduce the dark current generation. Oxide layer 203 covers the whole structure and serves also as a gate oxide for MOS transistors (not shown). This layer is covered by another layer of oxide 204 that serves as isolation for metal wiring. The n+ doped layer 205 is the portion of the junction gate that together with the p-doped layer 210 forms the junction. The p-type doped layer 210 provides the blocking barrier for signal electrons that are accumulated in another n-doped layer 211 where the potential wells are formed, thereby forming an n-p-n structure.

The JGP is adjacent to a pinned barrier that includes a p+ doped layer 206 and an n- type doped buried channel 211. Adjacent to the pinned barrier is the floating diffusion formed by n+ doped region 207. The pixels are separated from each other by channel stop p+ type doped regions 208 and 209. Another p+ type doped region 212 is placed under the FD to prevent electrons 214 from flowing to the FD. In general, electrons are diverted and cross the depletion edge boundary 215 to be collected in the JGP potential well. Electrons 213 generated by photons 217 flow directly to the JGP potential well. The metal vias 216 connect the JGP and FD to the wiring of the pixel that is not shown in FIG. 2.

Figure 3:
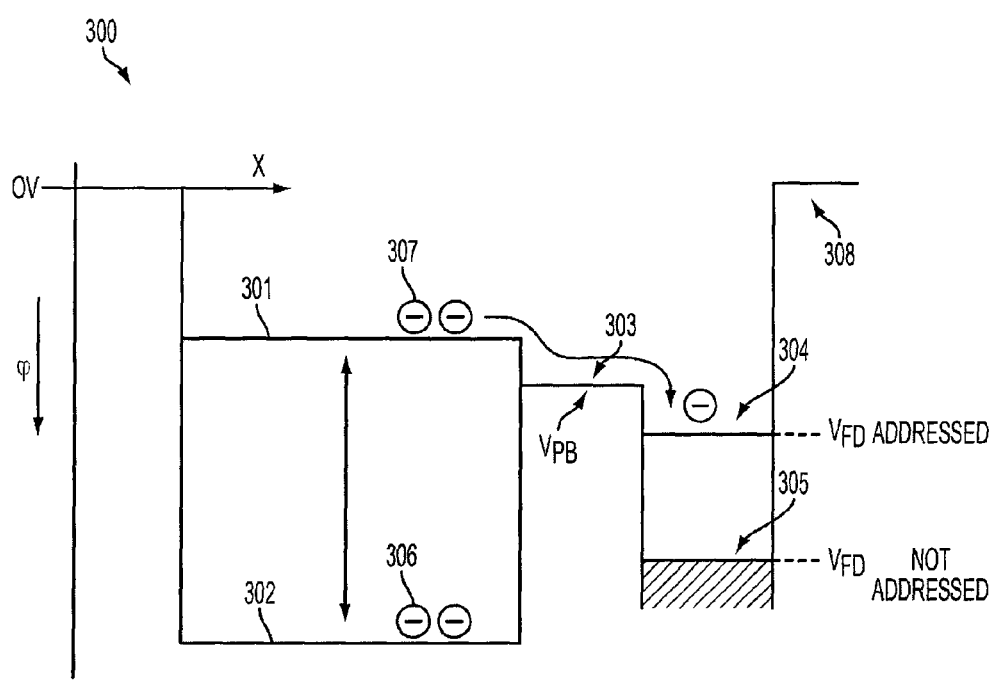
FIG. 3. shows a potential profile for the structure shown in FIG. 2, according to an embodiment of the present invention.

FIG. 3 shows a potential diagram of the potential maxima profile across the structure shown in FIG. 2. The potential in the channel stop region is ground 308 corresponding to 0V. The potential under the JGP has two levels (lower potential 301 and higher potential 302) respectively that correspond to low JGP bias and high JGP bias. When the JGP bias is high, the photon generated electrons 306 are collected in potential well 302. When the JGP bias is low, electrons 307 are transferred over the pinned barrier Vpb that has the potential 303, and flow into the FD region that is biased at potential level 304. In general, when the potential of the well is increased, the well is lowered (i.e. deeper), and when the potential of the well is decreased, the well is raised (i.e. shallow).

In general, this is the level of the FD regions in the addressed line. The FD regions of the un-addressed lines are biased at potential level 305. The advantage of the JGP, is its small size, built in anti-blooming, high well capacity, and low dark current. The dark current electrons that are generated at the silicon-silicon dioxide interface are not collected in the signal well, and flow into the n+ type doped region of JGP. Similarly the overflow electrons flow over barrier region 210 into the junction gate.

Figure 4:
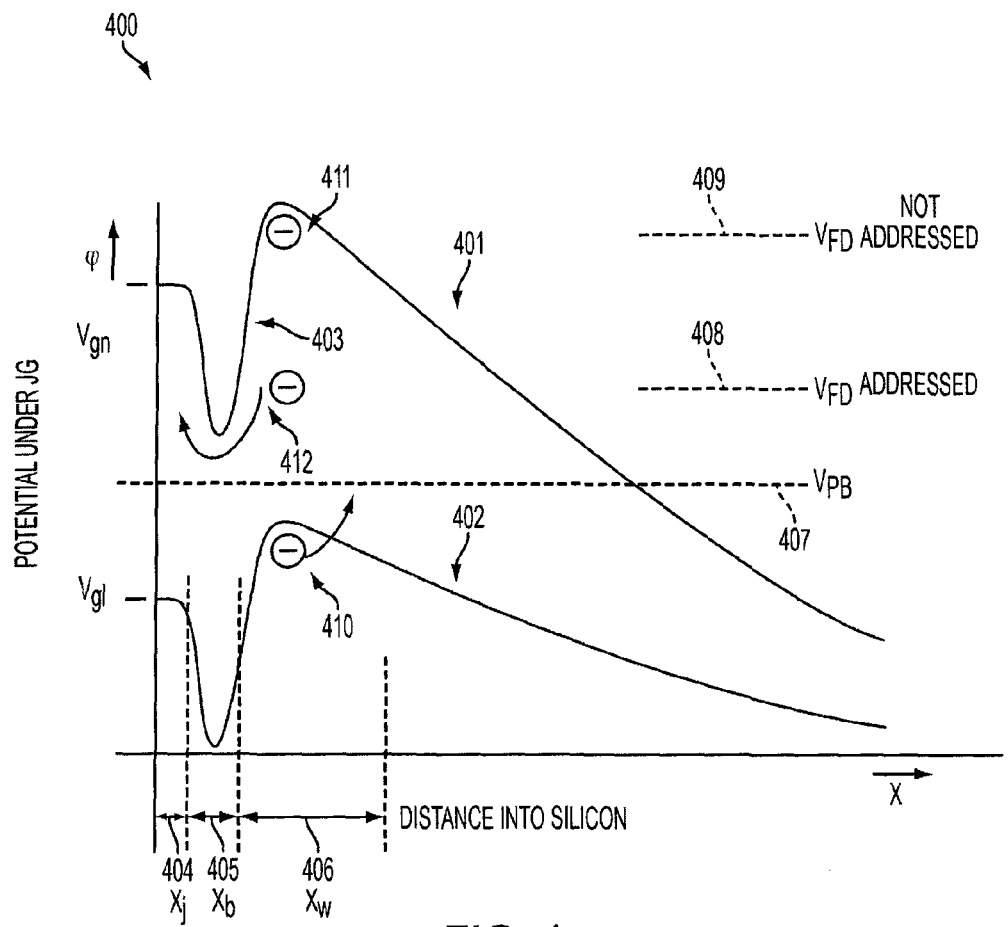
FIG. 4. shows a potential profile under the JGP, according to an embodiment of the present invention.

The potential profile under the JGP in a vertical direction from the surface of the silicon into the silicon bulk is shown in FIG. 4. Graph 401 represents the potential profile when the JGP is biased high and graph 402 shows the potential profile when the JGP is biased low. Electrons 411 are collected in JGP potential well 403 during high JGP bias, and are transferred as electrons 410 over the pinned barrier at level 407 into the FD region that is biased at level 408. The FDs of the un-addressed lines are biased at level 409. The n+ type doped region 205 corresponds to depth 404 where the first junction of the JGP is located. The p-type doped barrier region 405 forms the second junction of the JGP at the depth of xj+xb and also serves as the anti-blooming barrier that allows overflow electrons 412 to flow into the JGP. The n-type doped region 406 forms the potential well for the signal electrons.

Figure 5:
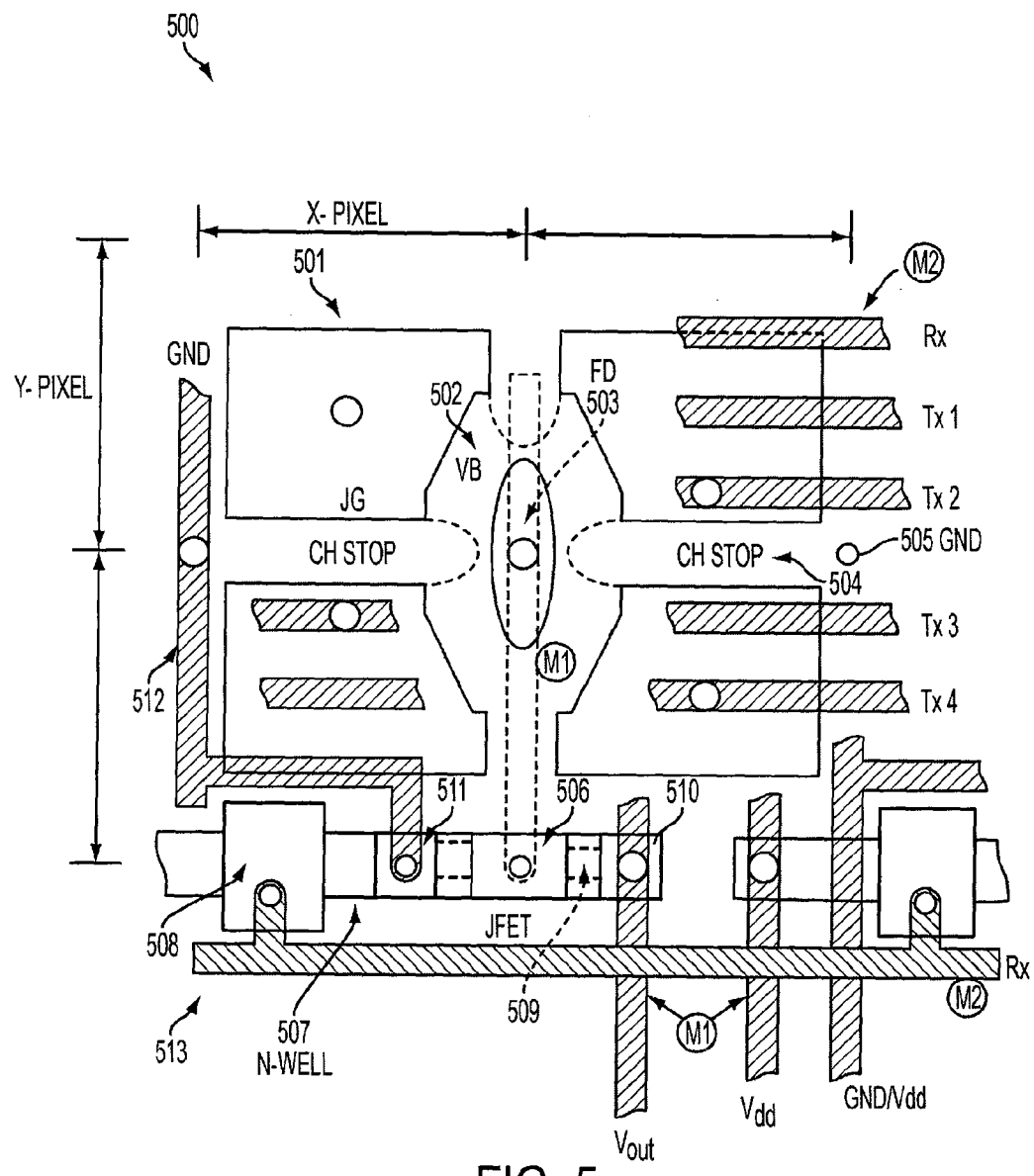
FIG. 5. shows a top view of a 4 JGP pixel layout where the JGPs share the same circuits, according to an embodiment of the present invention.

An example of one embodiment of the invention is shown in FIG. 5 which shows a top view of the group of 4-pixels that share common circuitry. Regions 501 are JGPs with adjacent pinned barriers 502. The FD region is region 503 that is connected by a metal wiring to the gate of p-channel JFET transistor 506. The channel of the JFET is region 509 with the source being region 510 and the drain being region 511 which is connected to ground. The JFET is located in a mini n-well 507, and mini n-well is reset to a Vdd potential by a reset transistor 508. In this embodiment, the 4 pixels are isolated from each other and from the rest of the pixels in the array by channel stop regions 504. The ground contact is contact 505 and the metal wiring 512 that is using the metal 1 (M1) layer is partially shown to simplify the figure. Metal 2 (M2) layer forms wiring 513.

Figure 6:
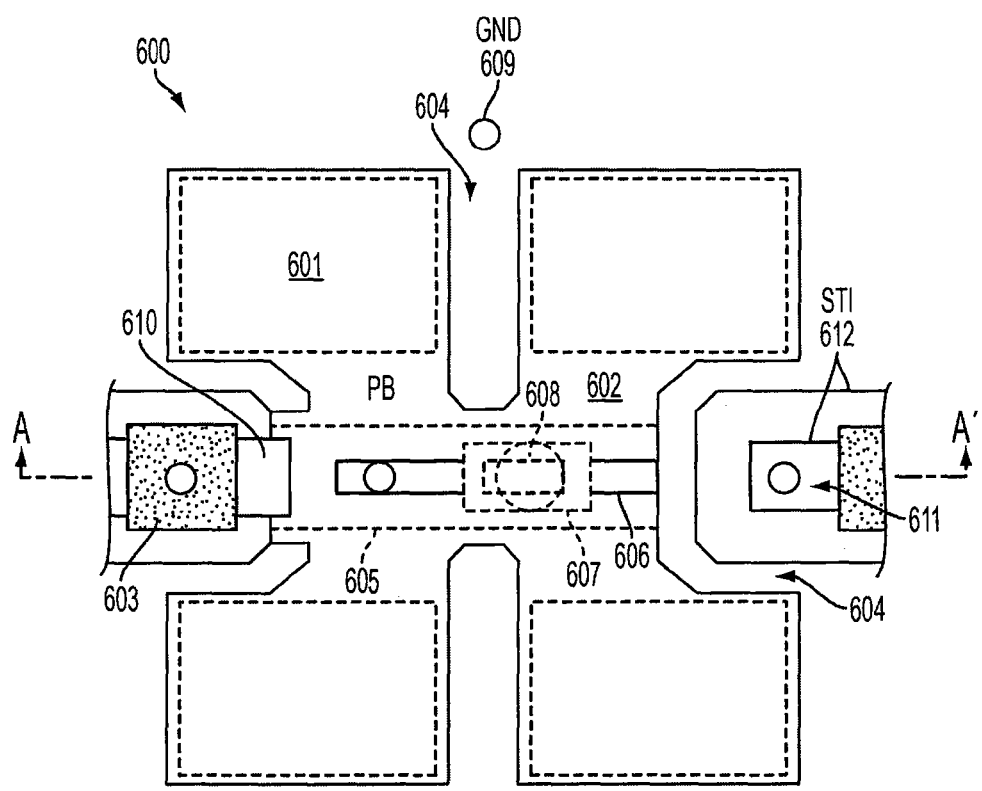
FIG. 6 shows another top view of a 4 JGP pixel layout where the JGPs share the same circuits including a JFET source follower, according to an embodiment of the present invention.

Another embodiment is shown in FIG. 6 which shows a top view of the 4 JGPs that share common circuitry. Region 601 are the JGPs that are separated from each other by the channel stop regions 604. The JGPs interface with pinned barrier regions 602 that further interface with a common mini n-well region 605. The mini n-well is reset by a reset transistor 603 that has drain region 611 and source region 610. Source region 610 is contiguous with the mini n-well. The mini n-well contains the p-channel JFET transistor that has channel 606. The gate 607 of this transistor is contiguous with the mini n-well.

Figure 7:
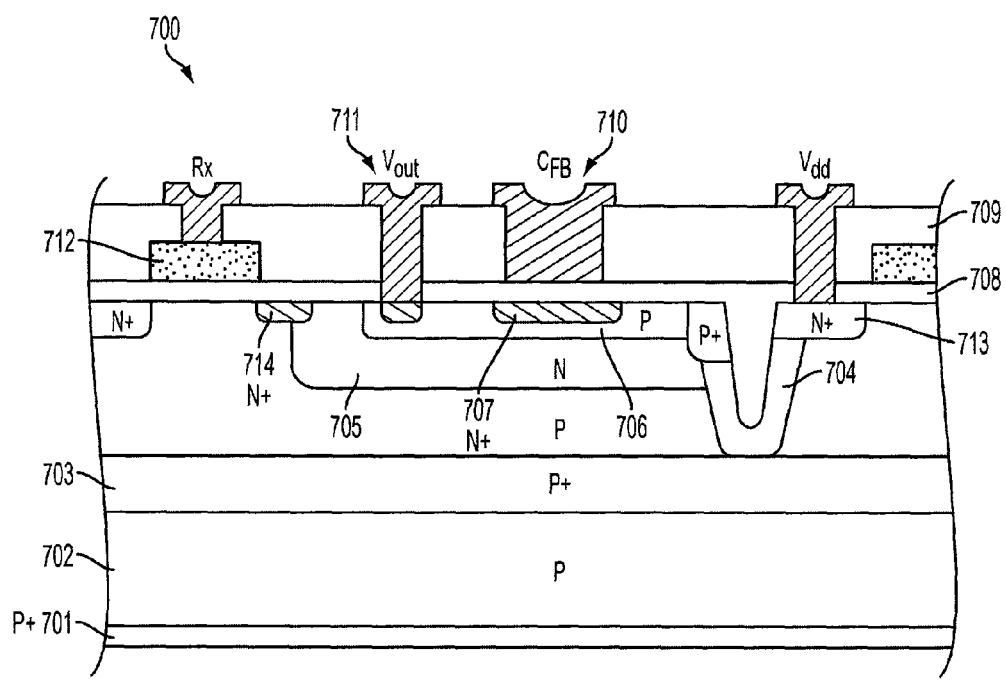
FIG. 7 is a cross-sectional view of the device shown in FIG. 6 through cut AA', according to an embodiment of the present invention.

There is also a feedback capacitor region 608 formed over the JFET gate which provides negative feedback from the column amplifier into the pixel. The circuit component isolation is provided by the STI region 612. The ground to the circuit is provided via the ground contact 609 to the channel stop region. To improve the clarity of the figure, the metal wiring was omitted from the diagram. For a better understanding of the pixel architecture, a cross-section through the cut AA' is shown in FIG. 7.

The device cross-section shows the p-type doped substrate 702 with a p+ type doped layer 701 at the device back surface that reduces the dark current generation. Another p+ type doped layer 703 is placed under the mini n-well 705 to prevent the photon generated electrons from the silicon bulk to flow into this region. The JFET channel is formed by region 706, and is pinched by the n+ type doped JFET gate 707 that is electrically connected to the mini n-well. An advantage of this structure is that a contact and a metal wire that is typically necessary for connecting the FD with the gate of the MOS transistor source follower may be eliminated. This saves valuable area of the pixel. Furthermore, the drain of the JFET transistor is connected to the channel stop region 704 that surrounds every pixel and is grounded to the ground bias via the contact 609 (not shown).

The reset of the mini n-well is provided by the reset transistor with gate 712, n+ type doped source 714 and drain 713. The structure has a gate oxide 708 grown on top of the silicon that serves as a gate insulator for the MOS transistors in other circuits of the image sensor array. Another oxide layer 709 is deposited on top of gate oxide 708, which provides the metal wiring isolation and which also fills the STI region defined by lines 612. A metal via to JFET source contact 711 provides the connection to the column signal line, and metal plug 710 provides the connection to the column feedback line, and at the same times forms a capacitor coupling to JFET gate 707. The drain of the JFET is connected to the STI p+ type doped isolation region and to the channel stop regions.

Figure 8:
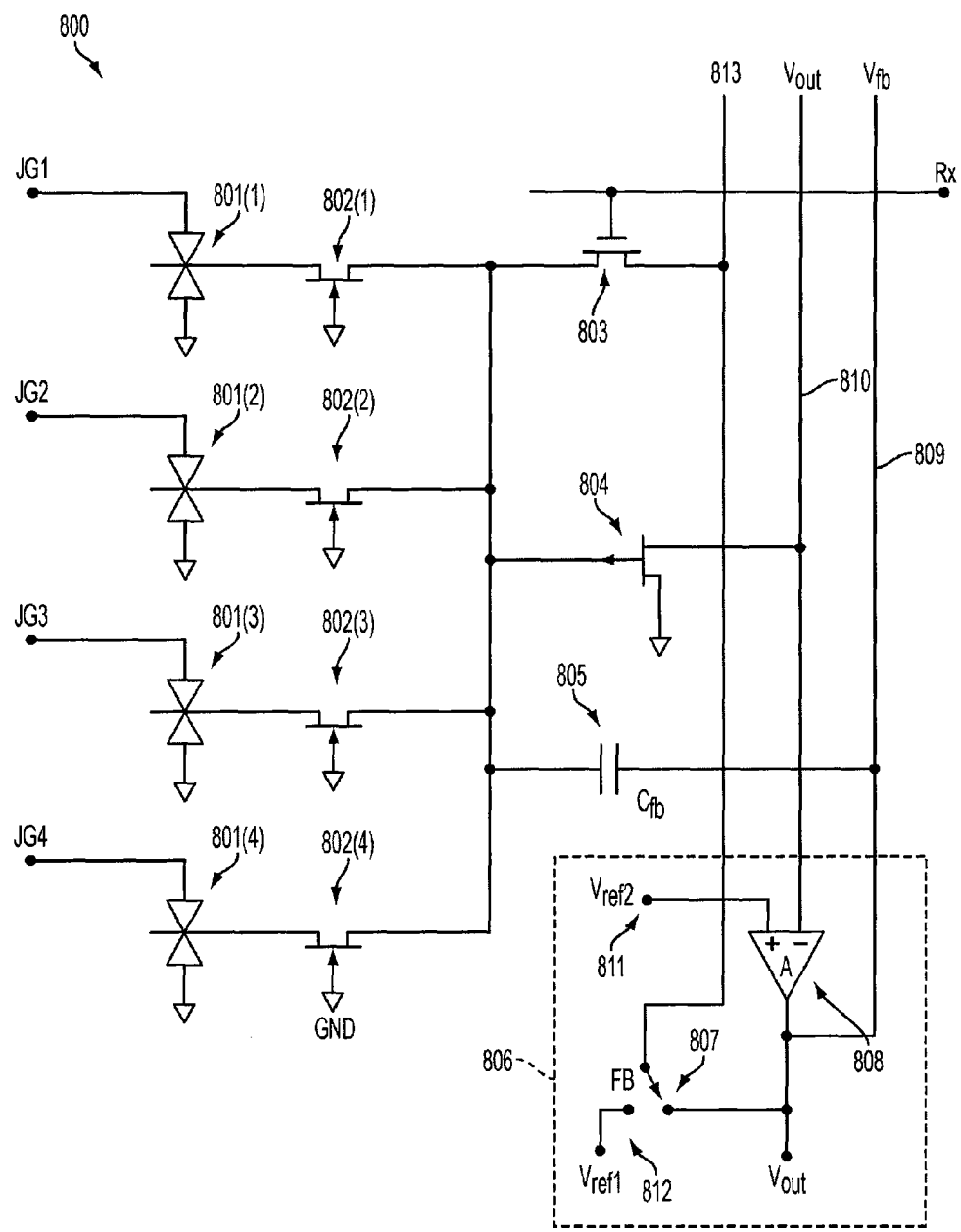
FIG. 8 is a schematic diagram of 4 JGPs that share the same circuits including a column amplifier, according to an embodiment of the present invention.

As shown in FIG. 8, the JGP is indicated by the symbol 801, which is connected to pinned barrier 802 that is an n-channel JFET transistor with a grounded gate. The pinned barrier interfaces with the gate of p-channel JFET transistor 804 that is reset by MOS transistor 803 to a voltage supplied through a column bus line 813. The output from the pixel is output on signal column bus line 810 and is supplied to the negative input node of inverting column feedback amplifier 808. The column circuit 806 therefore includes column amplifier 808 and switch 807. The output from the column amplifier is fed back to the pixels via another column feedback bus line 809, which is connected to pixel capacitors 805. The column amplifier block 806 also contains two references Vref1 812, and Vref2 811, that separate the addressed line SF outputs from the SF outputs of lines that are not addressed. The FD nodes of the un-addressed lines are biased to a higher level than the FD nodes of the addressed line.

Figure 9:
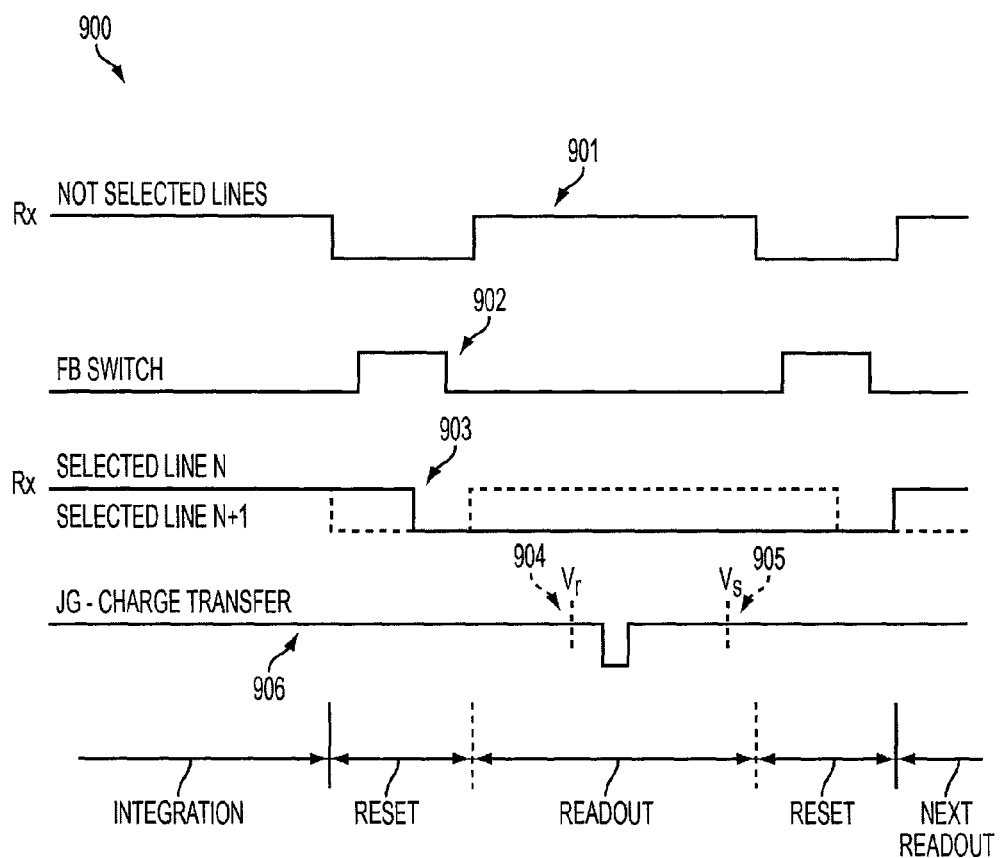
FIG. 9 shows a timing diagram for the sensor operation of the circuit shown in FIG. 8, according to an embodiment of the present invention.

The operation of the circuit is described in a circuit timing diagram 900 shown in FIG. 9. Trace 901 corresponds to the command signal sent to all the reset switches of un-addressed lines thereby turning them off when the bias is low. This essentially defines the pixel reset interval of the addressed line. During this time the feedback switch of column amplifier block 806 is turned on which changes the bias on column line 813 from the Vref1 to a voltage corresponding to an empty FD charge detection node. This resets the FD node to a voltage corresponding to reference 811 Vref2. During this interval, the reset transistor of the selected line is also turned off as indicated by the signal on command line 903 in the figure. The pixels of the selected row are now ready to receive charge, but before this occurs the reset transistors of the un-addressed lines are turned back on to make sure that the FD nodes of all the un-addressed lines are kept high biased to the Vref1 812. This turns off the p-channel JFET SF transistors that are connected to the same column signal line 810.

After the transients settle down, the amplifier output may be sampled at time 904. After that the JG is ready to be pulsed negative as shown by the signal on the command line 906, which transfers charge from the JGP onto the FD and the desired signal appears on the column signal line. This signal is sampled at time 905. The difference between the signals at sampling points 904 and 905 is the true output of the pixel. This method of sensing the difference is called the correlated double sampling (CDS) operation and has an advantage of removing kTC noise and various other pixel threshold non-uniformities from the signal.

An advantage of the concept described in this patent disclosure is that the CDS is incorporated into a circuit that includes the feedback amplifier and at the same time provides the row selection function without adding any other circuit components into the pixel except for a small feedback capacitor. The negative feedback directly into the pixel charge detection node is minimizing the FD voltage swing, thus allowing a larger voltage margin for the well capacity and a larger voltage separation between the transistors in the addressed and un-addressed rows.

Additional benefits are improved linearity, higher conversion gain, lower noise, and a wider DR. The feedback capacitor can be made small and precise which improves the pixel to pixel uniformity and achieves large conversion gains independent of the parameter variations of other circuit components.

It is noted that the column amplifier and the feedback capacitor may be optional. In another embodiment, the JGP pixel may be configured without feedback capacitor 805 and/or column amplifier 808. The pixel value, in this embodiment, would be output directly to the column line from JFET 804, and then sampled.

It is also noted that the light impinging on the JGP pixels may be filtered by a color filter array (CFA). For example, a Bayer patterned CFA may be implemented to filter the 4 JGPs shown in FIG. 8.

It is also noted that various control voltages for controlling the JGP, and the imager in general, (e.g. reset control voltage, integration control voltage, readout control voltage, etc.) may be generated and applied by a controller (e.g. Micro-processor) that is not shown in the figures.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A junction gate photo-diode (JGP) pixel, comprising:
    a JGP accumulating charge in response to impinging photons, the JGP positioned on a substrate including a top n layer, a middle p layer and a bottom n layer forming a n-p-n junction, and a control terminal coupled to the top n layer;
    a floating diffusion (FD) positioned on the substrate and coupled to a pixel output line through an amplifier; and
    a pinned barrier (PB) positioned on the substrate between the JGP and the FD, the PB temporarily blocking charge transfer between the JGP and the FD,
    wherein the accumulated charge is transferred from the JGP to FD by applying a control voltage to the JGP control terminal.

2. The JGP pixel of claim 1,
    wherein the PB is a junction field-effect transistor (JFET) having a gate that is grounded, and a source and a drain coupling the JGP to the FD.

3. The JGP pixel of claim 1, including
    a plurality of other JGPs positioned on the substrate, the JGPs coupled to the FD through a plurality of respective junction field effect transistors (JFET) positioned on the substrate, and the FD coupled to the pixel output line through another JFET.

4. The JGP pixel of claim 3,
    wherein the pixel output line is coupled to a column amplifier input terminal, and the column amplifier output terminal is coupled to the FD through a feedback capacitor.

5. The JGP pixel of claim 4,
    wherein light impinging on the JGPs are filtered by red, green and blue color filters arranged as a patterned color filter array (CFA).

6. The JGP pixel of claim 3,
    wherein the FD is coupled to a reset line by a metal oxide semi-conductor (MOS) transfer gate.

7. The JGP pixel of claim 1,
    wherein a plurality of JGP pixels are positioned on the substrate in an array as a complementary metal oxide semi-conductor (CMOS) imager.

8. A method for controlling a junction gate photo-diode (JGP) pixel, the pixel comprising a JGP, the JGP positioned on a substrate including a top n layer, a middle p layer and a bottom n layer forming a n-p-n junction, and a control terminal coupled to the top n layer, a floating diffusion (FD) positioned on the substrate and coupled to a pixel output line through an amplifier, a pinned barrier (PB) positioned on the substrate between the JGP and the FD, a reset gate positioned on the substrate and coupled to the FD, and a controller, the method comprising:
    applying, by the controller, during a reset period, a reset control voltage to the reset gate to clear charge accumulated in the JGP and FD, and
    applying, by the controller, during an integration period, an integration control voltage to the JGP to accumulate charge in the JGP, and
    applying, by the controller, during a readout period, a readout control voltage to the JGP to transfer the accumulated charge from the JGP over the PB and into the FD for pixel readout.

9. The JGP pixel of claim 8,
    controlling, by the controller, the reset gate to couple the JGP and FD to a reset potential during the reset period.

10. The JGP pixel of claim 8,
    controlling, by the controller, the integration control voltage to increase a potential of a well of the JGP to be greater than a potential of the PB to accumulate charge.

11. The JGP pixel of claim 8,
    controlling, by the controller, the readout control voltage to decrease a potential of a well of the JGP to be less than a potential of the PB to transfer charge over the PB and into the FD.

12. The JGP pixel of claim 8, including a plurality of other JGPs positioned on the substrate, the JGPs coupled to the FD through a plurality of respective junction field effect transistors (JFET) positioned on the substrate, and the FD coupled to the pixel output line through another JFET, the method comprising:
    controlling, by the controller, the reset gate to apply a reset potential to the FD and the JGPs.

13. The JGP pixel of claim 8, including a plurality of other JGPs positioned on the substrate, the JGPs coupled to the FD through a plurality of respective junction field effect transistors (JFET) positioned on the substrate, and the FD coupled to the pixel output line through another JFET, the method comprising:

controlling, by the controller, a plurality of integration control voltages to independently increase potentials of a plurality of respective wells for the respective JGPs to accumulate charge.

14. The JGP pixel of claim 8, including a plurality of other JGPs positioned on the substrate, the JGPs coupled to the FD through a plurality of respective junction field effect transistors (JFET) positioned on the substrate, and the FD coupled to the pixel output line through another JFET, the method comprising:

controlling, by the controller, a plurality of readout control voltages to independently decrease potentials of a plurality of respective wells for the respective JGPs to transfer charge over the PB and into the FD.

15. A method for forming a junction gate photo-diode (JGP) pixel on a substrate, the method comprising:

forming a JGP on a substrate, the JGP including a top n layer, a middle p layer and a bottom n layer forming a n-p-n junction, and a control terminal coupled to the n layer, the JGP accumulating charge in response to impinging photons;

forming a floating diffusion (FD) on the substrate;

forming a pinned barrier (PB) on the substrate between the JGP and the FD, the PB temporarily blocking charge transfer between the JGP and the FD; and forming pixel wiring on the substrate above the JGP, FD and PB, the pixel wiring coupled to the JGP control terminal and the FD.

16. The JGP pixel of claim 15, including forming a plurality of other JGPs and respective PBs on the substrate, the JGPs positioned around the FD, the JGPs separated from the FD by the respective PBs.

17. The JGP pixel of claim 16, including forming channel stop regions on the substrate around each JGP, the channel stop regions isolating the JGPs from each other.

18. The JGP pixel of claim 16, including forming an n-well on the substrate interfacing with the JGPs; and forming a JFET in the n-well to produce a voltage on the pixel output line in response to charge stored in the n-well.

19. The JGP pixel of claim 18, including forming a feedback capacitor in the n-well to provide negative feedback from a column amplifier to control the n-well.

20. The JGP pixel of claim 18, including forming a p doped region below the n-well to block the flow of electrons into the n-well.

* * * * *